United States Patent [19]

Eggemann

[11] 3,931,673
[45] Jan. 13, 1976

[54] ALUMINUM FOR BONDING SI-GE ALLOYS TO GRAPHITE

[75] Inventor: Robert V. Eggemann, Warren, N.J.

[73] Assignee: The United States of America as represented by the United States Energy Research and Development Administration, Washington, D.C.

[22] Filed: Oct. 8, 1969

[21] Appl. No.: 866,113

[52] U.S. Cl. ................... 29/573; 29/590; 29/589; 136/205; 136/237; 357/71
[51] Int. Cl.² ......................................... B01J 17/00
[58] Field of Search .......... 29/590, 589, 472.5, 573; 136/205, 237; 317/234, 235.2, 235.3

[56] References Cited
UNITED STATES PATENTS

| | | | |
|---|---|---|---|
| 2,937,324 | 5/1960 | Kroko | 317/234 |
| 3,122,424 | 2/1964 | King | 29/473.1 |
| 3,442,718 | 5/1969 | Dingwell et al. | 136/205 |
| 3,447,233 | 6/1969 | Webb | 29/573 X |

Primary Examiner—W. Tupman
Attorney, Agent, or Firm—Dean E. Carlson; Leonard Belkin

[57] ABSTRACT

Improved thermoelectric device and process, comprising the high-temperature, vacuum bonding of a graphite contact and silicon-germanium thermoelectric element by the use of a low void, aluminum, metallurgical shim with low electrical resistance sandwiched therebetween.

1 Claim, 5 Drawing Figures

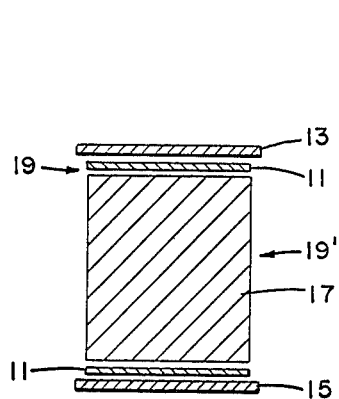
Fig. 1
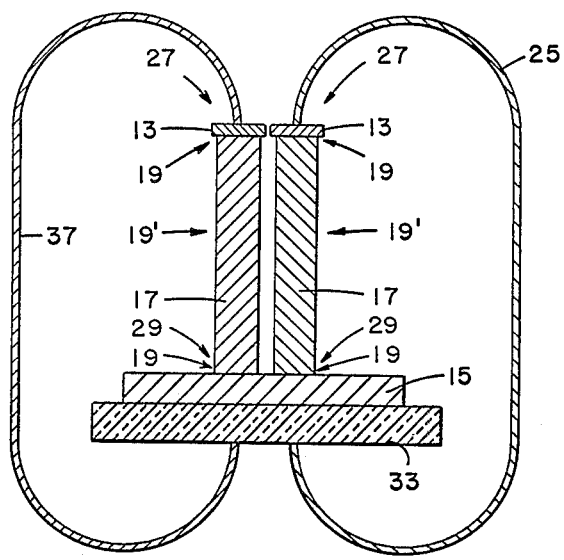
Fig. 5
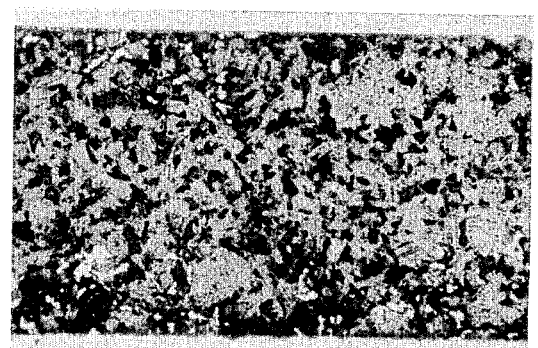

ALUMINUM FOR BONDING SI-GE ALLOYS TO GRAPHITE

RELATED APPLICATIONS

Ser. No. 679,281 filed Jan. 5, 1968, by James E. Monroe, now U.S. Pat. No. 3,620,808.

Ser. No. 502,945 filed Oct. 23, 1965 by G. F. Dingwall et al., now U.S. Pat. No. 3,442,718.

Ser. No. 841,958 filed July 15, 1969 by Arthur J. Seuffert, now U.S. Pat. No. 3,627,650.

BACKGROUND OF THE INVENTION

Advantageously, thermoelectric converters operate reliably for long periods of time at high hot junction temperatures for producing high electrical power outputs, and to this end various systems employing radioisotope heat sources for Si-Ge thermocouples have become useful. In this regard, a heat transfer means, such as a fluid heated by the source, supplies heat to the hot junction of the thermocouple and another heat transfer means, such as a cooled fluid and/or radiator, cools the cold junction of the thermocouple to provide a high temperature differential across the thermocouple, whereby the electrical output of the converter corresponds to the temperature differential across the converter, while the high performance of the thermocouple and a high hot junction temperature has depended on a stable mechanical, chemical and metallurgical configuration.

Report NYO 3582-12, illustrates one example of such a thermoelectric device. As shown, for example in FIG. 3.5-1 of this report, the device comprises both "N" and "P" elements having end pieces, comprising shoes, straps, insulators, contacts, flexible connectors, and hot and cold plates that contain heat transfer fluids that circulate through respective hot and cold plates by means of suitable pumps, heat pipes or the like. The elements (N and P) have the same or different lengths. Similarly, the "N" and "P" elements (legs) of the device and their end pieces have various thicknesses, cross-sections, and cross-sectional areas, e.g. the same or different rectangular cross-sectional areas.

SUMMARY OF THE INVENTION

In accordance with this invention, made in the course of, or under a contract with the United States Atomic Energy Commission, clean aluminum shim interposed between the graphite contact and the Si-Ge thermoelectric element, provides an improved means for securing the graphite and Si-Ge conductive contact elements. In this regard, the process of this invention provides an improved thermocouple fabrication process for bonding the graphite contact and the Si-Ge thermocouple element, wherein the aluminum shim when exposed to high temperature in a vacuum, bonds the graphite and Si-Ge thermocouple with low-electrical contact resistance, negligible chemical interaction, and provides mechanical strength over a wide range of temperatures, shocks, vibrations, and launch conditions, into a space orbit.

BRIEF DESCRIPTION OF THE DRAWINGS

In the drawings where like elements have like reference numbers:

FIG. 1 illustrates a partial cross-section through the device of this invention;

FIG. 3 illustrates a photomicrograph of the as bonded condition provided by the aluminum shim of FIG. 1, showing SiGe penetration into an intermediate layer of graphite sandwiched between tungsten at the top and SiGe at the bottom of the photomicrograph;

FIG. 4 illustrates a photomicrograph of the as bonded condition provided by the elements of FIG. 3 after 3,000 hours at 900°C, which shows no change in penetration distance and indicates the stability of the material thereof.

FIG. 5 illustrates a partial schematic drawing of the assembly means for providing the aluminum shim bonding of the elements of FIG. 1, in accordance with this invention.

DESCRIPTION OF THE PREFERRED EMBODIMENT

Figure 2:
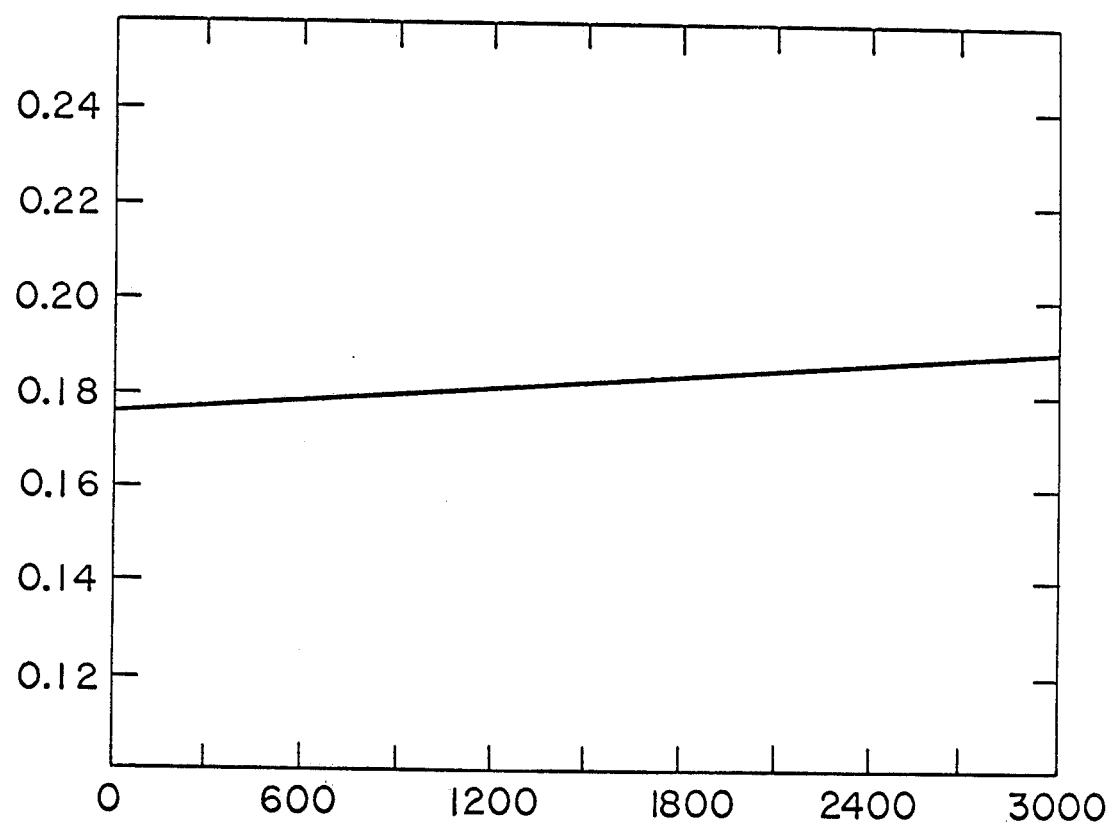
FIG. 2 represents a graphic illustration of a performance curve of the device of FIG. 1, having a graphite Si-Ge bond in accordance with this invention.

The preferred embodiment of this invention provides an improved bond between a graphite contact and a "P" type Si-Ge thermoelectric element leg for operation over a wide temperature range for use in space. However, as understood from the following, this invention has utility in a wide variety of thermoelectric devices for a wide variety of temperature ranges and applications.

Referring now to FIG. 1, in one embodiment, this invention utilizes the following elements listed in the following table I.

TABLE I

| No. | Part | Dimension | Material |
|---|---|---|---|
| 11 | Al Shim | 0.325" × 340" × 0.005" | Aluminum |
| 13 | Barrier | 0.364" × 0.364" × 0.020" | Graphite |
| 17 | Pellet | 0.325" × 0.340" × 0.400" | SiGe Alloy |
| 15 | Barrier | 0.364" × 0.364" × 0.020" | Graphite |

In accordance with this embodiment, the above-mentioned elements provide diffusion of the Si-Ge into the graphite for securing the conductive contact elements, comprising graphite contacts 13 and 15 and a P type thermoelectric element 17, made of silicon-germanium. To this end, the aluminum shim 11, when exposed to high temperature in a vacuum between the thermocouple and graphite end pieces produces a diffusion of the Si-Ge into the graphite, which it has been discovered, provides good physical connection between the graphite contact, and thermoelectric element 17, low-electrical contact resistance, negligible chemical interaction in the bond zone 19 at operating temperatures, sufficient mechanical connection to maintain the bond stable and effective over a wide temperature range, and effectively withstands severe shock and vibration during assembly and operation, particularly in launchings into space. In accordance with this invention, moreover, the bond resulting from the use of the shim 11 of this invention, which sandwiches between the parts to be bonded, i.e., element 17 and contact 13 and/or 15, at high temperature in a vacuum, has a low void space, with mechanical strength greater than the weakest member in the system, and wherein no changes in physical, chemical or electrical characteristics occur with extended times at temperatures up to at least 900°C.

The following table II illustrates the isothermal testing of the Si-Ge thermoelectric element 17 having a graphite contact bonded thereto across a bond zone 19 produced with shim 11 in accordance with this invention.

TABLE II

| Isothermal Testing at 900°C | |
|---|---|
| Hours at Temperature | Room Temperature Contact Resistance in Milliohms |
| 0 (as bonded) | 0.18 |
| 16 at 900°C | 0.16 |
| 200 at " | 0.17 |
| 1000 at " | 0.18 |
| 2000 at " | 0.20 |
| 3000 at " | 0.19 |

The following table III illustrates the room temperature resistance of the Si-Ge thermoelectric element 17 having a graphite contact bonded thereto across a bond zone 19 produced with shim 11 in accordance with this invention.

TABLE III

| Room temperature contact resistance after thermal cycling- Ambient to 800°C and return (2 hr. cycle) | |
|---|---|
| Cycles | Contact Resistance in Milliohms |
| 0 | 0.12 |
| 5 | 0.12 |
| 10 | 0.14 |
| 20 | 0.12 |

Referring to FIG. 2, the graphic representation thereof shows that the contact resistance increases by less than 0.02 milliohms in 3,000 hrs. at a test temperature of 900°C. In this graph, the abscissa represents contact resistance in milliohms measured at room temperature and the ordinate represents the time in hours that the graphite-thermocouple bond of this invention was heated at 900°C.

FIG. 3 shows an actual photomicrograph of the as bonded condition showing the SiGe penetration that occurs in bond area 19 with the Al-shim 11. In this FIG. 3, and FIG. 4, which shows no change in penetration in bond zone 19 (indicating stability) after 3,000 hours at 900°C, reference number 21 indicates Si-Ge in a portion of thermocouple 17, 19 the bond zone, 13 the graphite wafer, and 21' a tungsten contact bonded to the graphite, as described in the above-referenced report.

In accordance with one embodiment of the bonding method of this invention, a suitably cleaned aluminum shim 11 provides the basis for the desired SiGe penetration into the graphite. To this end before the bonding between the graphite contact and the SiGe thermoelectric element ultrasonic vibration and etching cleans the aluminum shim 11 in a dilute NaOH solution. Thereafter, a deionized water wash, a strong $HNO_3$ solution, and further deionized water neutralizes cleans, washes and removes the NaOH solution from the etched aluminum shim 11. Thereupon, acetone removes the other liquids from the etched aluminum shim 11 and a gentle flow of warm air removes the acetone by evaporation from the etched aluminum shim 11. The bonding of the resulting etched aluminum shim 11, comprises the respective assembly of aluminum shims 11 between element 17 and the graphite contacts 13 and 15 at the opposite ends of element 17, and heating of the assembly 19' in a vacuum at a temperature above the soldius temperature of the element 17.

In one example of the above described process, the following parameters apply:

EXAMPLE I

For: Aluminum shim 11 - Alcoa Aluminum, 1 mil thick foil
1. Aluminum cleaning process:***
   a. Etch in 4% NaOH* solution at 55°C ± for 15 sec. in ultrasonic.
   b. Rinse in water for 1 min. ultrasonic.
   c. Desmutter in 50% Nitric Acid solution for 15 sec. in ultrasonic.**
   d. Rinse in clean water for 1 min. ultrasonic.
   e. Rinse in deionized water for 1 min. ultrasonic.
   f. Rinse in Acetone for 1 min. ultrasonic.
   g. Blow dry in hot air.

\* 12.51 gms/300 cc $H_2O$
\*\* 150 cc Nitric Acid - 150 cc $H_2O$
\*\*\* Pyrex Beakers 2. Assembly of shim 11 between element 17 and graphite shoes 13 and 15.
3. Bonding - vacuum pressure $10^{-5}$ mm Hg, temperature ≈ 1150°C, and time ≈ approximately 5 minutes.

FIG. 5, illustrates apparatus 23 for performing the described method. Here, clamp 25, advantageously made of tungsten, holds contacts 13 and 15 at the opposite ends of thermoelectric element 17 to sandwich shims 11 therebetween. In this embodiment cold shoe 27 forms from a graphite contact 13 having an aluminum shim 11 sandwiched between this contact 13 and a "P" type Si-Ge thermoelectric element 17. Hot shoe 29 forms from graphite contact 15 with an aluminum shim 11 sandwiched between this contact 15 and the other end of thermoelectric element 17. Also, by employing ceramic flat 33 between graphite contact 15 and tungsten clamp 25, the graphite contact 15 also bonds to an "N" type Si-Ge thermoelectric element 17. To this end, clamp 37 holds flat 33 against graphite contact 15, which has an aluminum shim 11 sandwiched between graphite contact 15 and an "N" type Si-Ge thermoelectric element 17. Thus, when exposed to high temperature in a vacuum, the clamped contacts 13 and 15 provide bond zones 19 in respective shoes 27 and 29. Likewise, clamp 37 holds another graphite contact 13 to sandwich an aluminum shim 11 against the "N" type Si-Ge thermoelectric element 17 for forming another cold shoe 27. After removing clamps 25 and 37, the cold shoes can be bonded to suitable tungsten elements for assembly in series with further thermoelectric elements (not shown) in accordance with the described process and by employing the described assembly apparatus.

In the described process the thermoelectric elements and end pieces may have the following parameters: C(13) 0.490 inch × 0.180 inch × 0.020 inch; Al(11) 0.460 inch × 0.150 inch × 20.001 inches; SiGe(17) 0.460 inch × 0.150 inch × 0.420 inch; Al(11) 0.460 inch × 0.150 inch × 20.001 inches; C(15) 0.490 × 0.180 inch × 0.020 inch.

What is claimed is:
1. Method for producing a thermoelectric device having a graphite contact for a silicon-germanium thermoelectric element, comprising the steps of:
   a. cleaning an aluminum shim by sequentially vibrating said aluminum shim in dilute NaOH, de-ionized water, strong $HNO_3$, deionized water and acetone, and a gentle flow of warm air;

b. sandwiching said shim between said graphite contact and said silicon-germanium thermoelectric element; and
c. bonding said graphite contact and silicon-germanium thermoelectric element with said aluminum shim sandwiched there between in a vacuum at a temperature above the solidus temperature for the silicon-germanium thermoelectric element.

* * * * *